(12) United States Patent
Cui et al.

(10) Patent No.: US 10,504,746 B2
(45) Date of Patent: Dec. 10, 2019

(54) HKMG INTEGRATION

(71) Applicant: Applied Materials, Inc., Santa Clara, CA (US)

(72) Inventors: Zhenjiang Cui, San Jose, CA (US); Xing Zhong, Foster City, CA (US); Jie Liu, Sunnyvale, CA (US); Linlin Wang, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1 day.

(21) Appl. No.: 15/484,527

(22) Filed: Apr. 11, 2017

(65) Prior Publication Data

US 2017/0294320 A1    Oct. 12, 2017

Related U.S. Application Data (60) Provisional application No. 62/321,631, filed on Apr. 12, 2016.

(51) Int. Cl.
*H01L 21/3213* (2006.01)
*H01L 29/49* (2006.01)
(Continued)

(52) U.S. Cl.
CPC .. *H01L 21/32136* (2013.01); *H01J 37/32357* (2013.01); *H01J 37/32422* (2013.01); *H01L 21/02071* (2013.01); *H01L 21/28088* (2013.01); *H01L 21/31138* (2013.01); *H01L 21/32137* (2013.01); *H01L 21/32139* (2013.01);
(Continued)

(58) Field of Classification Search
CPC ......... H01L 21/31144; H01L 21/30655; H01L 21/31055; H01L 21/31111; H01L 21/312; H01L 21/308; H01L 21/02071; H01L 21/28088; H01L 21/31138; H01L 21/32136; H01L 21/32137; H01L 21/32139; H01L 29/4966; H01L 29/517;
(Continued)

(56) References Cited

U.S. PATENT DOCUMENTS 5,419,805 A    5/1995 Jolly
9,039,911 B2   5/2015 Hudson et al.
(Continued)

FOREIGN PATENT DOCUMENTS

WO    97/11482 A2    3/1997

*Primary Examiner* — Lan Vinh
(74) *Attorney, Agent, or Firm* — Patterson + Sheridan LLP (57) ABSTRACT

A method for processing a semiconductor substrate is described herein. The method described herein includes generating fluorine radicals and ions, delivering the fluorine radicals through an ion blocker to a processing region, and removing one or more portions of a gate structure to expose one or more portions of a gate dielectric material disposed thereunder. The gate structure includes at least two ceramic or metal layers, and the gate dielectric material is made of a high-k dielectric material. A substrate having the gate structure and gate dielectric material formed thereon is disposed in the processing region, and the temperature of the substrate is maintained at about 60 degrees Celsius or higher. By etching the gate structure using fluorine radicals at a temperature greater or equal to 60 degrees Celsius, the at least two ceramic or metal layers have a flat cross sectional profile.

17 Claims, 4 Drawing Sheets

(51) Int. Cl.
*H01L 21/28* (2006.01)
*H01L 29/51* (2006.01)
*H01L 21/02* (2006.01)
*H01L 21/311* (2006.01)
*H01J 37/32* (2006.01)
*H01L 29/66* (2006.01)

(52) U.S. Cl.
CPC ........ H01L 29/4966 (2013.01); H01L 29/517 (2013.01); H01L 29/66795 (2013.01)

(58) Field of Classification Search
CPC ........... H01L 29/66795; H01L 21/3065; H01L 21/31127; H01J 37/32357; H01J 37/32422
USPC ....... 438/706, 710, 712, 714, 719, 725, 715; 156/345.3, 345.34, 345.39
See application file for complete search history.

(56) References Cited

U.S. PATENT DOCUMENTS

| | | |
|---|---|---|
| 9,082,826 B2 | 7/2015 | Chandrashekar et al. |
| 9,147,581 B2 | 9/2015 | Guha |
| 2006/0087400 A1* | 4/2006 | Chinthakindi ......... H01C 7/006 338/309 |
| 2007/0117396 A1* | 5/2007 | Wu ....................... B08B 7/0035 438/710 |
| 2010/0043821 A1* | 2/2010 | Li ........................... G03F 7/427 134/1.2 |
| 2013/0029484 A1* | 1/2013 | Shimizu ............ H01L 21/31116 438/636 |
| 2014/0302678 A1 | 10/2014 | Paterson et al. |
| 2014/0302680 A1 | 10/2014 | Singh et al. |
| 2014/0302681 A1 | 10/2014 | Paterson et al. |
| 2015/0017810 A1* | 1/2015 | Guha ................ H01L 21/31116 438/714 |
| 2015/0083582 A1 | 3/2015 | Dhindsa et al. |
| 2015/0206772 A1 | 7/2015 | Takimoto et al. |
| 2015/0214067 A1* | 7/2015 | Zhang ............... H01J 37/32422 438/724 |
| 2015/0332941 A1* | 11/2015 | Tobin ................ H01L 21/31116 156/345.48 |
| 2015/0364339 A1 | 12/2015 | Guha |
| 2015/0364349 A1 | 12/2015 | Guha |
| 2016/0203990 A1* | 7/2016 | Singh ................... H01L 21/3065 438/714 |

* cited by examiner

HKMG INTEGRATION

CROSS-REFERENCE TO RELATED APPLICATIONS

This application claims priority to U.S. Provisional Patent Application Ser. No. 62/321,631, filed on Apr. 12, 2016, which herein is incorporated by reference.

BACKGROUND

Field

Embodiments described herein generally relate to a method for processing semiconductor substrates, and more specifically, to a method for etching a gate structure in a transistor.

Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. As circuit integration increases, the need for greater uniformity and process control regarding layer characteristics rises.

For example, ultra-large-scale integrated (ULSI) circuits typically include more than one million transistors that are formed on a semiconductor substrate and which cooperate to perform various functions within an electronic device. Such transistors may include complementary metal-oxide-semiconductor (CMOS) field effect transistors. A CMOS transistor includes a gate structure that is disposed between a source region and a drain region defined in the semiconductor substrate. The gate structure (stack) generally comprises a gate electrode formed on a gate dielectric material.

Transistors may also be formed as 3 dimensional or 3D circuits as compared to traditional planar circuits. 3D transistors may employ gates that form conducting channels on three sides of a vertical "fin" structure, allowing chips to operate at lower voltage with lower leakage. Examples of three dimensional transistors having such gate structures include a fin field effect transistor (FinFET).

High-k metal gate (HKMG) technology has become one of the leading technologies for CMOS and FinFET devices. HKMG includes a high-k dielectric material as the gate dielectric material, and the high-k dielectric material reduces leakage current and improves dielectric constant. HKMG also includes a metal gate structure, which allows the gate to be adjusted to low threshold voltages. HKMG technology reduces gate leakage, leading to increased transistor's coupling efficiency and allowing chips to function with reduced power.

However, as CMOS and FinFET technologies progress to sub-10 nm node, it has become more challenging to selectively etch the metal gate structure. For example, wet etch processes suffer from poor profile control and dry etch processes, such as reactive ion etch (RIE) process, have insufficient selectivity against the high-k gate dielectric material.

Therefore, an improved method is needed to etch a gate structure.

SUMMARY

In one embodiment, a method includes placing a substrate into a plasma processing chamber, forming a plasma in a plasma cavity of the plasma processing chamber, and flowing radicals in the plasma to a processing region of the plasma processing chamber. Ions in the plasma are blocked from entering the processing region. The method further includes removing one or more portions of a gate structure disposed on the substrate.

In another embodiment, a method includes placing a substrate into a plasma processing chamber. The substrate includes a gate structure disposed thereon, and the gate structure includes two or more layers. The two or more layers are made of different materials. The method further includes forming a plasma in a plasma cavity of the plasma processing chamber, and flowing radicals in the plasma to a processing region of the plasma processing chamber. Ions in the plasma are blocked from entering the processing region. The method further includes removing one or more portions of the gate structure disposed on the substrate.

In another embodiment, a method includes placing a substrate into a plasma processing chamber, forming a plasma in a plasma cavity of the plasma processing chamber, and flowing radicals in the plasma to a processing region of the plasma processing chamber. Ions in the plasma are blocked from entering the processing region. The method further includes removing one or more portions of a gate structure disposed on the substrate and removing one or more photoresists and residue radicals disposed on the substrate.

BRIEF DESCRIPTION OF THE DRAWINGS

So that the manner in which the recited features of the present disclosure can be understood in detail, a more particular description of the disclosure may be had by reference to embodiments, some of which are illustrated in the appended drawings. It is to be noted, however, that the appended drawings illustrate only exemplary embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one aspect may be advantageously adapted for utilization in other aspects described herein.

DETAILED DESCRIPTION

A method for processing a semiconductor substrate is described herein. The method described herein includes generating fluorine radicals and ions, delivering the fluorine radicals through an ion blocker to a processing region, and removing one or more portions of a gate structure to expose one or more portions of a gate dielectric material disposed thereunder. The gate structure includes at least two ceramic or metal layers, and the gate dielectric material is made of a high-k dielectric material. A substrate having the gate structure and gate dielectric material formed thereon is disposed in the processing region, and the temperature of the substrate is maintained at about 60 degrees Celsius or higher. By etching the gate structure using fluorine radicals at a temperature greater or equal to 60 degrees Celsius, the at least two ceramic or metal layers have a flat cross sectional profile.

Figure 1:
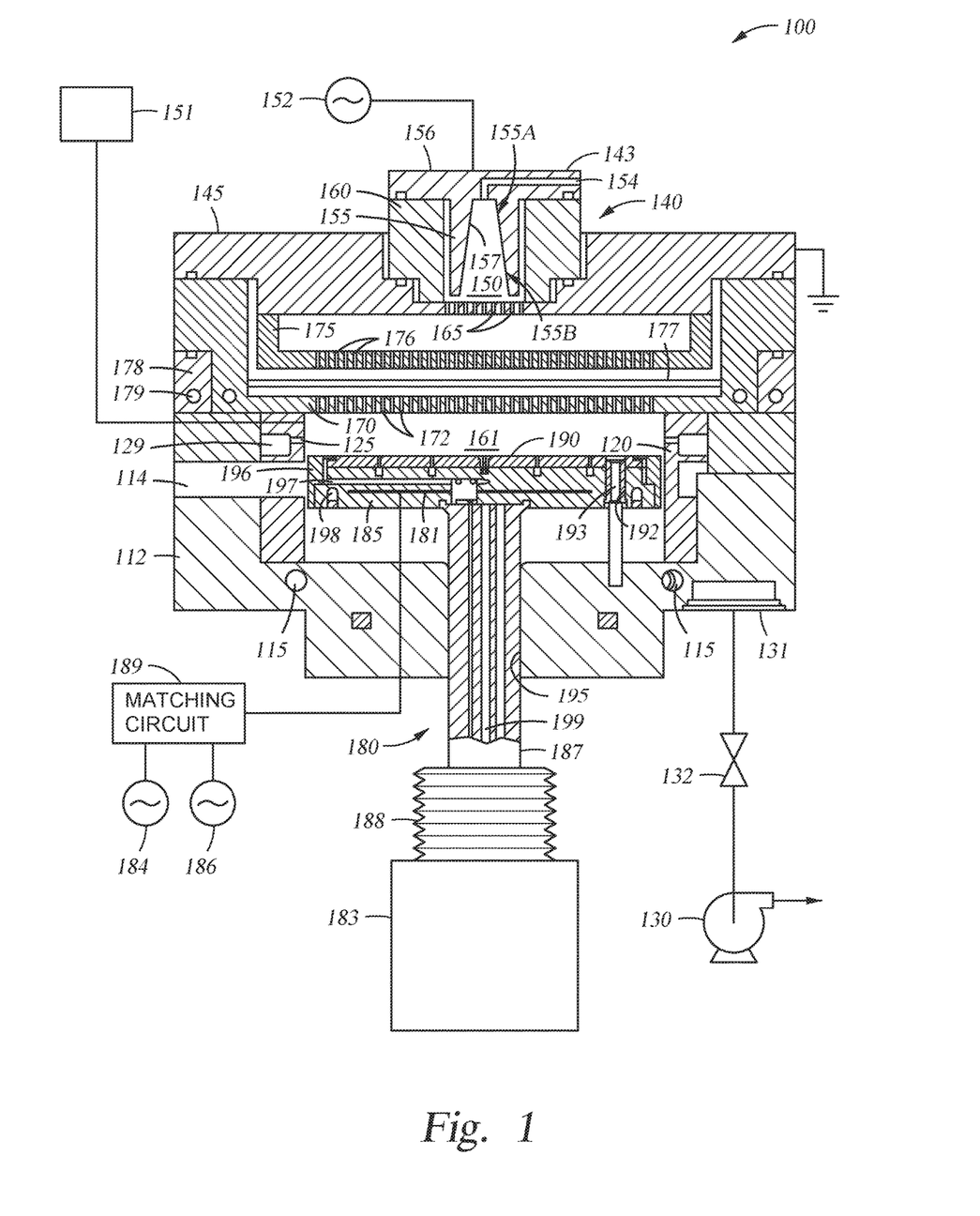
FIG. 1 is a schematic, cross sectional view of a plasma process chamber, which can be used to perform methods described herein.

FIG. 1 is a schematic, cross sectional view of a plasma process chamber 100, which can be used to perform methods described herein. One plasma process chamber 100 suitable for practicing embodiments described herein is a Frontier™ plasma processing chamber which is available from Applied Materials Inc., located in Santa Clara, Calif. It is noted that other plasma processing chambers available from other manufactures may also be adapted to practice the embodiments described herein.

The plasma processing chamber 100 includes a chamber body 112, a lid assembly 140, and a support assembly 180. The lid assembly 140 is disposed at an upper end of the chamber body 112, and the support assembly 180 is at least partially disposed within the chamber body 112. The chamber body 112 includes a slit valve opening 114 formed in a sidewall thereof to provide access to a processing region 161 of the plasma processing chamber 100. The chamber body 112 may include a channel 115 formed therein for flowing a heat transfer fluid therethrough. The heat transfer fluid can be a heating fluid or a coolant and is used to control the temperature of the chamber body 112 during processing. The chamber body 112 may further include a liner 120 that surrounds the support assembly 180. The liner 120 is removable for servicing and cleaning. The liner 120 can be made of a metal such as aluminum, a ceramic material, or any other process compatible material. The liner 120 may include one or more apertures 125 and a pumping channel 129 formed therein that is in fluid communication with a vacuum port 131. The apertures 125 provide a flow path for gases into the pumping channel 129, which provides an egress for the gases within the plasma processing chamber 100 to the vacuum port 131.

A vacuum system is coupled to the vacuum port 131. The vacuum system may include a vacuum pump 130 and a throttle valve 132 to regulate flow of gases through the plasma processing chamber 100 and to regulate pressure inside the plasma processing chamber 100. The vacuum pump 130 is coupled to a vacuum port 131 disposed in the chamber body 112 and therefore, in fluid communication with the pumping channel 129 formed within the liner 120.

The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143,145. In one or more embodiments, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof. In one embodiment, a fluorine containing gas, such as $NF_3$, is introduced into the plasma cavity 150 via the one or more gas inlets 154. In another embodiment, a fluorine containing gas and an oxygen containing gas, such as $O_2$, are introduced into the plasma cavity 150 via the one or more gas inlets 154.

In one or more embodiments, the first electrode 143 has an expanding section 155 that bounds the plasma cavity 150. In one or more embodiments, the expanding section 155 is an annular member that has an inner surface or diameter 157 that gradually increases from an upper portion 155A thereof to a lower portion 155B thereof. As such, the distance between the first electrode 143 and the second electrode 145 is variable across the expanding section 155. The varying distance helps control the formation and stability of the plasma generated within the plasma cavity 150.

In one or more embodiments, the expanding section 155 resembles an inverted truncated cone or "funnel." In one or more embodiments, the inner surface 157 of the expanding section 155 gradually slopes from the upper portion 155A to the lower portion 155B of the expanding section 155. The slope or angle of the inner diameter 157 can vary depending on process requirements and/or process limitations. The length or height of the expanding section 155 can also vary depending on specific processes.

Additional process/carrier gases may be introduced into the processing region 161. These process/carrier gases are not excited to form a plasma and may be introduced into the processing region 161 via a gas source 151.

The lid assembly 140 may further include an isolator ring 160 that electrically isolates the first electrode 143 the second electrode 145. The isolator ring 160 surrounds or substantially surrounds at least the expanding section 155. The lid assembly 140 may further include a distribution plate 170 and a blocker plate 175 adjacent the second electrode 145. The distribution plate 170 may be disposed on a lid rim 178 which is connected to the chamber body 112. The lid rim 178 can include an embedded channel or passage 179 for circulating a heat transfer medium. The second electrode 145 may include a plurality of gas passages or apertures 165 formed beneath the plasma cavity 150 to allow a plasma formed in the plasma cavity 150 to flow therethrough. The blocker plate 175 may include a plurality of gas passages or apertures 176 to allow the plasma to flow therethrough. The plasma formed in the plasma cavity 150 may include both radicals and ions of the species energized by the plasma source 152. The ions, such as fluorine ions, may be blocked from entering the processing region 161 by an ion blocker 177 disposed between the blocker plate 175 and the distribution plate 170. The distribution plate 170 may include a plurality of gas passages or apertures 172 to distribute the flow of the radicals therethrough. The apertures 172 can be sized and positioned about the distribution plate 170 to provide a controlled and even flow distribution of the radicals to the processing region 161 of the chamber body 112 where the substrate to be processed is located.

The support assembly 180 may include a support member 185 to support a substrate (not shown) for processing within the chamber body 112. The support member 185 may be coupled to a lift mechanism 183 through a shaft 187 which extends through a centrally-located opening 195 formed in a bottom surface of the chamber body 112. The lift mechanism 183 can be flexibly sealed to the chamber body 112 by bellows 188 that prevents vacuum leakage from around the shaft 187. The lift mechanism 183 allows the support member 185 to be moved vertically within the chamber body 112 between a process position and a lower transfer position. The transfer position is slightly below the slit valve opening 114 formed in a sidewall of the chamber body 112 so that the substrate may be robotically removed from the substrate support member 185.

The support member 185 may include a substantially flat, circular surface for supporting a substrate to be processed thereon. The support member 185 may include a removable top plate 190. The substrate (not shown) may be secured to the support member 185 using an electrostatic chuck. An electrostatic chuck typically includes at least a dielectric material that surrounds an electrode 181, which may be located on the support member 185 or formed as an integral part of the support member 185. The dielectric portion of the chuck electrically insulates the chuck electrode 181 from the substrate and from the remainder of the support assembly 180.

In one embodiment, the electrode 181 is coupled to a plurality of RF power bias sources 184, 186. There may be one RF power bias source, while the other bias source is optional. In the embodiment depicted in FIG. 1, the dual RF bias power sources 184, 186 are coupled to the electrode 181 disposed in the support member 185 through a matching circuit 189. The support member 185 may include bores 192 formed therethrough to accommodate lift pins 193, one of which is shown in FIG. 1. Each lift pin 193 is constructed of ceramic or ceramic-containing materials, and are used for substrate-handling and transport. The support assembly 180 may further include an edge ring 196 disposed about the support member 185. The edge ring 196 may be an annular member that is adapted to cover an outer perimeter of the support member 185 and protect the support member 185 from the etchant. The edge ring 196 can be positioned on or adjacent the support member 185 to form an annular purge gas channel between the outer diameter of support member 185 and the inner diameter of the edge ring 196. The annular purge gas channel can be in fluid communication with a purge gas conduit 197 formed through the support member 185 and the shaft 187. The purge gas conduit 197 is in fluid communication with a purge gas supply (not shown) to provide a purge gas to the purge gas channel. Any suitable purge gas such as nitrogen, argon, or helium, may be used alone or in combination. The temperature of the support assembly 180 may be controlled by a fluid circulated through a fluid channel 198 embedded in the body of the support member 185. In one or more embodiments, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to heat the support member 185 and substrate disposed thereon. In some embodiments, a heating element may be embedded in the support member 185 for heating the substrate disposed thereon.

Figure 2:
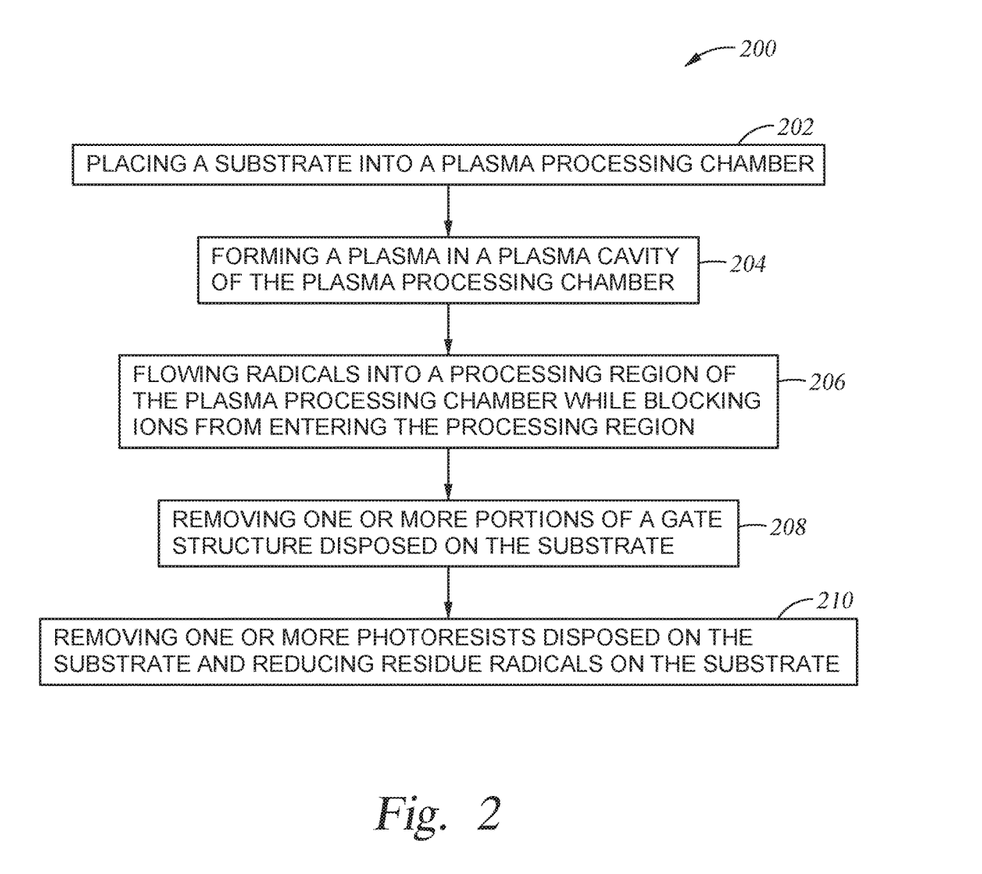
FIG. 2 is a flow diagram of a method for etching a gate structure disposed on a substrate according to one embodiment described herein.

FIG. 2 is a flow diagram of a method for 200 etching a gate structure disposed on a substrate according to one embodiment described herein. The method 200 starts with block 202, which is placing a substrate into a plasma processing chamber. The plasma processing chamber may be the plasma process chamber 100 shown in FIG. 1 or any other suitable plasma processing chamber. The substrate may include a gate structure disposed thereon. The substrate may be heated to a temperature of at least 60 degrees Celsius. The temperature of the substrate may range from about 60 degrees Celsius to about 300 degrees Celsius.

Figure 3A:
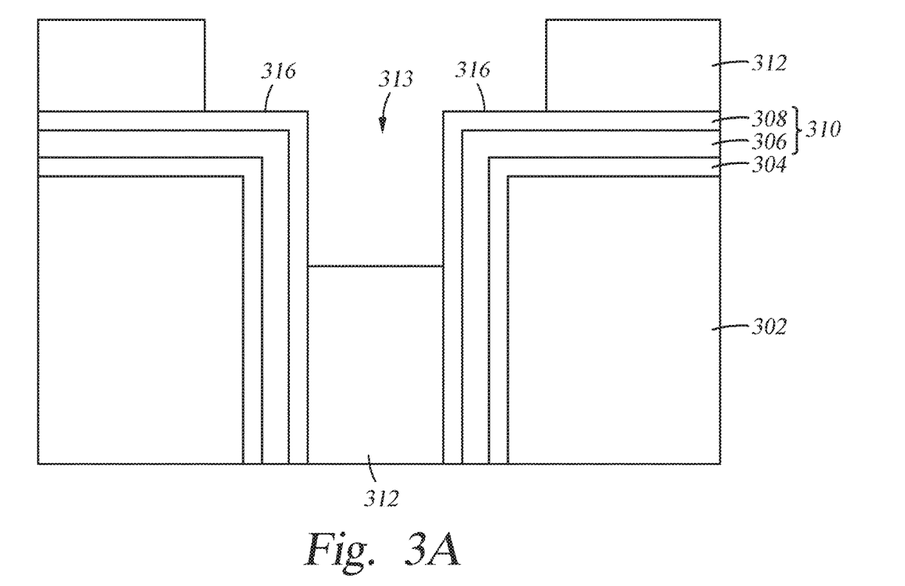
FIG. 3A is a schematic, cross sectional side view of the gate structure prior to the etching method according to one embodiment described herein.

FIG. 3A is a schematic, cross sectional side view of the gate structure 310 prior to an etch process according to one embodiment described herein. As shown in FIG. 3A, one or more dielectric columns 302, such as silicon oxide columns, may be disposed on the substrate. A gate dielectric material 304 may be disposed on the one or more dielectric columns 302. The gate dielectric material 304 may be made of a high-k dielectric material, such as hafnium oxide. The gate structure 310 may be disposed on the gate dielectric material 304. The gate structure 310 may include two or more layers 306, 308. Two layers 306, 308 are shown in FIG. 3A, but three, four or more layers may be part of the gate structure 310. The two or more layers 306, 308 each may be made of a ceramic material or a metal, such as TiN, TiSiN, TaN, TiAl, or alloys thereof. The two or more layers 306, 308 may be made of different materials. In one embodiment, the layer 306 is made of TiSiN and the layer 308 is made of TaN. A photoresist 312 may be disposed over each dielectric column 302, and each photoresist 312 may cover a portion of the gate structure 310 while one or more portions 316 of the gate structure 310 may be exposed. A photoresist 312 may be disposed within an opening 313 formed between adjacent dielectric columns 302.

Referring back to FIG. 2, at block 204, a plasma is formed in a plasma cavity of the plasma processing chamber. The plasma cavity may be the plasma cavity 150 shown in FIG. 1. In one embodiment, a fluorine containing gas is introduced into the plasma cavity and is energized to form a plasma including fluorine ions and radicals. In another embodiment, a fluorine containing gas and an oxygen containing gas are introduced into the plasma cavity and are energized to form a plasma including fluorine ions and radicals and oxygen ions and radicals. The oxygen radicals may be used to control the etch rate of a layer of the gate structure that is made of TaN.

Next, at block 206, the fluorine radicals are flowed into a processing region of the plasma processing chamber. The processing region may be the processing region 161 shown in FIG. 1, and the substrate may be disposed within the processing region. The fluorine ions are blocked by an ion blocker, such as the ion blocker 177 shown in FIG. 1. The ion blocker blocks substantially all of the ions, such as fluorine ions, in the plasma from entering the processing region. The radicals, such as the fluorine radicals, may remove the exposed one or more portions 316 of the gate structure 310, as shown at block 208. The removal of the exposed one or more portions 316 of the gate structure 310 may be performed by a radical etching process. A power source coupled to the plasma processing chamber, such as the power source 152 shown in FIG. 1, may provide a RF power ranging from about 30 W to about 1000 W at a frequency of about 13.6 MHz. The pressure inside of the plasma processing chamber during the radical etching process may range from about 0.7 Torr to about 10 Torr, and the temperature of the substrate may range from about 60 degrees Celsius to about 300 degrees Celsius, such as from about 60 degree Celsius to about 100 degrees Celsius. The radicals, such as fluorine radicals, react with the materials of the gate structure to form volatile by-products including $TiF_x$, $TaF_x$, $SiF_x$, or any suitable volatile by-products. The volatility of the by-products is strongly affected by the temperature of the substrate. Thus, at a temperature below 60 degrees Celsius, it is very difficult to form a gate structure having a flat cross sectional profile. In addition, radical etching performed at a temperature of about 60 degrees Celsius or higher has a better etch selectivity against the gate dielectric material disposed under the gate structure. Thus, the gate dielectric material, such as the high-k gate dielectric material, disposed under the gate structure is not damaged during the radical etching process.

Figure 3B:
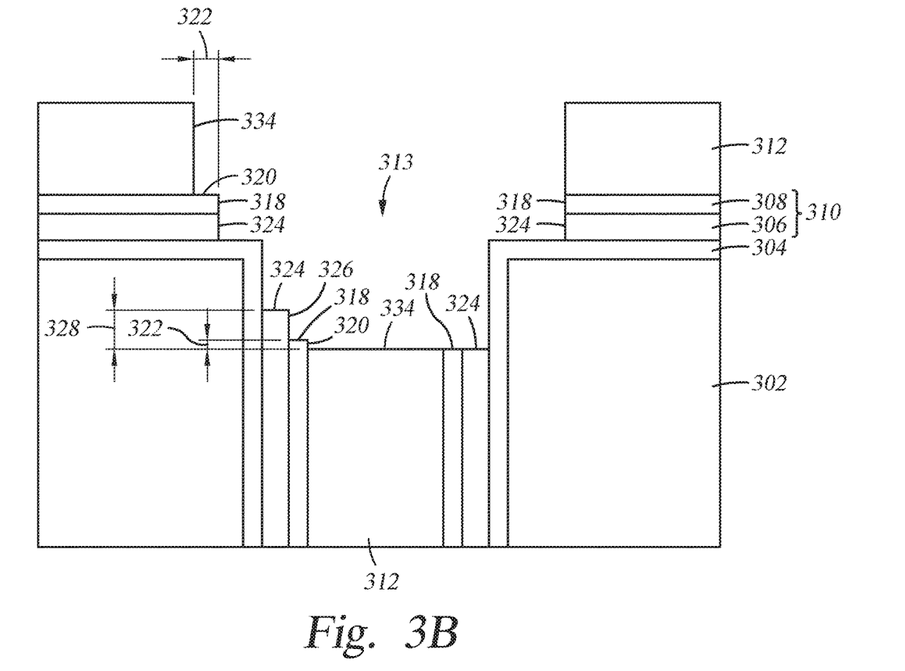
FIG. 3B is a schematic, cross sectional side view of the gate structure after one or more portions of the gate structure are removed, according to one embodiment described herein.

FIG. 3B is a schematic, cross sectional side view of the gate structure after removing one or more portions of the gate structure according to one embodiment described herein. As shown in FIG. 3B, one or more portions of the gate structure are removed, exposing portions of the gate dielectric material. The layers 306, 308 of the gate structure have a flat cross sectional profile. In other words, each layer 306, 308 include at least an edge 318, 324, respectively, that is substantially perpendicular to the gate dielectric material disposed thereunder, as shown in FIG. 3B. In addition, each layer 306, 308 may extend over an edge of a layer disposed thereon or adjacent thereto by at most 30 Angstroms. For example, the layer 308 may include the edge 318 extending over the edge 334 of the photoresist 312 disposed thereon or adjacent to by a distance 322, and the distance 322 is at most 30 Angstroms. The layer 306 includes the edge 324 that extends over the edge 318 of the layer 308 disposed thereon by a distance 328, and the distance 328 is at most 30 Angstroms. In other words, each layer 306, 308 may include an exposed portion 326, 320, respectively, and the exposed portion 326, 320 may each has a width of at most 30 Angstroms.

Figure 3C:
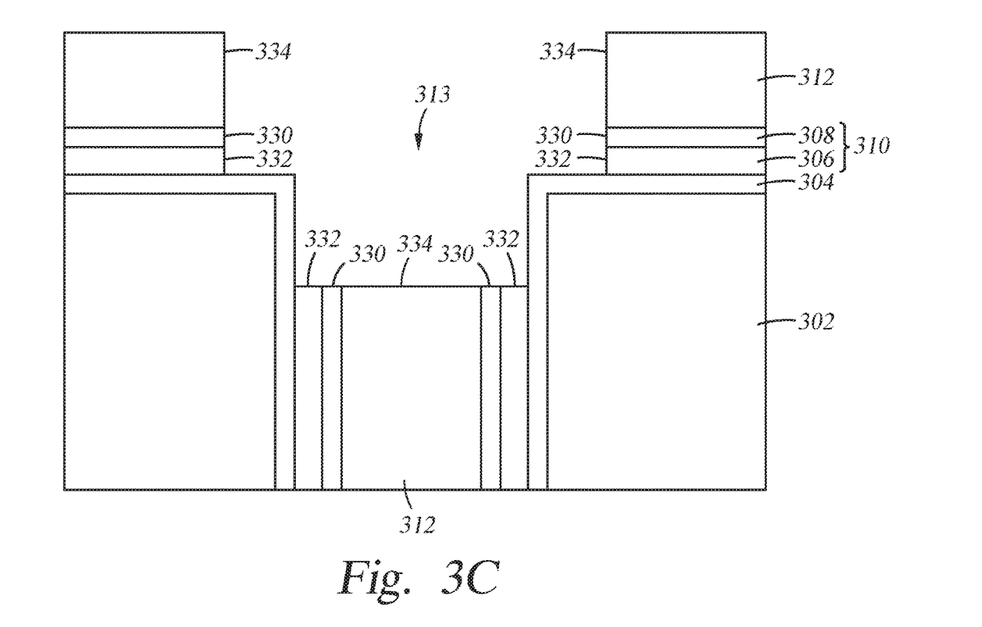
FIG. 3C is a schematic, cross sectional side view of the gate structure after one or more portions of the gate structure are removed, according to another embodiment described herein.

FIG. 3C is a schematic, cross sectional side view of the gate structure after one or more portions of the gate structure are removed, according to another embodiment described herein. As shown in FIG. 3C, the layers 306, 308 may include edges 332, 330, respectively, and the photoresists 312 may include the edge 334. The edges 332, 330, 334 may be substantially perpendicular to the gate dielectric material and may be aligned, as shown in FIG. 3C. In some embodiments, more than two layers form the gate structure, and each layer has a flat cross sectional profile. As shown in both FIGS. 3B and 3C, the gate dielectric material, such as the high-k gate dielectric material, is not damaged by the radical etching process.

Referring back to FIG. 2, at block 210, the one or more photoresists, such as the one or more photoresists 312 shown in FIGS. 3A-3C, and the residue radicals, such as the residue fluorine radicals, on the substrate are removed. The removal of the photoresists and the residue radicals may be removed in the same processing chamber or in a different processing chamber. In one embodiment, the photoresists and the residue radicals are removed in a loadlock chamber having a remote plasma source (RPS) coupled thereto. A post-etch process may be performed in the loadlock chamber in order to remove the one or more photoresists and the residue radicals. The post etch process may include hydrogen radicals formed by the RPS. In one embodiment, hydrogen gas or water vapor may be flowed into the RPS, and the RPS energizes the hydrogen gas or water vapor to form hydrogen radicals. The RPS may not produce any ions as the hydrogen gas or water vapor is energized. The RPS may be a high power RPS capable of generating at least 5000 W of RF power at a frequency of 13.6 MHz. The substrate may be heated to a temperature of 300 degrees Celsius or above. The post-etch process utilizing hydrogen radicals not only remove the one or more photoresists but also remove residue radicals on the substrate from the radical etching process. By minimizing radicals used in the radical etching process on the substrate, the potential of radicals, such as fluorine radicals, penetrating the gate dielectric material is reduced. In some embodiments, the plasma processing chamber used to perform the radical etching process and the loadlock chamber used to perform the post-etch process are coupled to a single transfer chamber, which reduces the overall number of process steps.

Figure 3D:
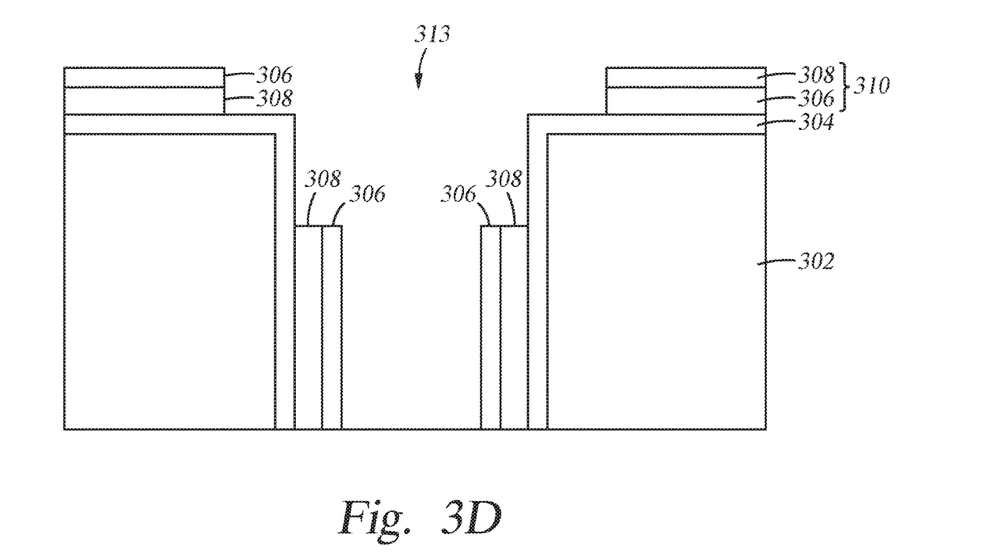
FIG. 3D is a schematic, cross sectional side view of the gate structure after removing one or more photoresists according to one embodiment described herein.

FIG. 3D is a schematic, cross sectional side view of the gate structure after removing one or more photoresists according to one embodiment described herein. As shown in FIG. 3D, the photoresists are removed and each layer 306, 308 of the gate structure 310 have a flat cross sectional profile.

While the foregoing is directed to embodiments of the present disclosure, other and further embodiments of the disclosure may be devised without departing from the basic scope thereof, and the scope thereof is determined by the claims that follow.

The invention claimed is:

1. A method, comprising:
   placing a substrate into a plasma processing chamber;
   forming a plasma in a plasma cavity of the plasma processing chamber;
   flowing radicals in the plasma to a processing region of the plasma processing chamber, wherein ions in the plasma are blocked from entering the processing region; and
   removing a portion of two layers of a gate structure disposed on the substrate by the radicals in an radical etching process, wherein each of the two layers comprises TiN, TiSiN, TaN, TiAl, or alloys thereof, wherein the ions are blocked from entering the processing region during the radical etching process, wherein a temperature of the substrate during the removing of the portion of the two layers ranges from about 60 degrees Celsius to about 300 degrees Celsius.

2. The method of claim 1, wherein the two layers are made of different materials.

3. The method of claim 1, wherein the gate structure is disposed on a gate dielectric material.

4. The method of claim 3, wherein the gate dielectric material comprises a high-k dielectric material.

5. The method of claim 1, wherein the radicals flowing into the processing region comprise fluorine radicals.

6. The method of claim 5, wherein the radicals flowing into the processing region further comprise oxygen radicals.

7. A method, comprising:
   placing a substrate into a plasma processing chamber, wherein the substrate includes a gate structure disposed thereon and a photoresist disposed on the gate structure, wherein the gate structure includes two layers, the photoresist is disposed on a first portion of the two layers, and the two layers are made of different materials;
   forming a plasma in a plasma cavity of the plasma processing chamber;
   flowing radicals in the plasma to a processing region of the plasma processing chamber, wherein ions in the plasma are blocked from entering the processing region; and
   removing a second portion of the two layers of the gate structure disposed on the substrate by the radicals in an radical etching process, wherein the ions are blocked from entering the processing region during the radical etching process, wherein a temperature of the substrate during the removing of the second portion of the two layers ranges from about 60 degrees Celsius to about 300 degrees Celsius, wherein the first portion of the two layers is covered by the photoresist and a third portion of the two layers is exposed after the removing of the second portion of the two layers.

8. The method of claim 7, wherein the two layers each comprises TiN, TiSiN, TaN, TiAl, or alloys thereof.

9. The method of claim 7, wherein a distance between an edge of the third portion of the two layers and an edge of the photoresist is at most 30 Angstroms.

10. The method of claim 7, wherein third portion has a width of at most 30 Angstroms.

11. The method of claim 7, wherein the temperature of the substrate during the removing of the portions second portion of the two layers of the gate structure ranges from about 60 degrees Celsius to about 100 degrees Celsius.

12. A method, comprising:
placing a substrate into a plasma processing chamber, wherein the substrate includes a gate structure disposed on a high-k dielectric material and a photoresist disposed on the gate structure, wherein the gate structure includes two layers, the photoresist is disposed on a first portion of the two layers;
forming a plasma in a plasma cavity of the plasma processing chamber;
flowing radicals in the plasma to a processing region of the plasma processing chamber, wherein ions in the plasma are blocked from entering the processing region;
removing a second portion of the two layers of the gate structure by the radicals in an radical etching process, wherein the ions are blocked from entering the processing region during the radical etching process, wherein a temperature of the substrate during the removing of the second portion of the two layers ranges from about 60 degrees Celsius to about 300 degrees Celsius, wherein the first portion of the two layers is covered by the photoresist and a third portion of the two layers is exposed after the removing of the second portion of the two layers; and
removing the photoresist and residue radicals disposed on the substrate.

13. The method of claim 12, wherein the radicals flowing into the processing region comprise fluorine radicals.

14. The method of claim 12, wherein the two layers each comprises TiN, TiSiN, TaN, TiAl, or alloys thereof.

15. The method of claim 14, wherein the two or more layers are made of different materials.

16. The method of claim 15, wherein a distance between an edge of the third portion of the two layers and an edge of the photoresist is at most 30 Angstroms.

17. The method of claim 15, wherein the third portion has a width of at most 30 Angstroms.

* * * * *

UNITED STATES PATENT AND TRADEMARK OFFICE
CERTIFICATE OF CORRECTION

PATENT NO. : 10,504,746 B2
APPLICATION NO. : 15/484527
DATED : December 10, 2019
INVENTOR(S) : Zhenjiang Cui et al.

Page 1 of 1

It is certified that error appears in the above-identified patent and that said Letters Patent is hereby corrected as shown below:

In the Claims

In Column 9, Line 9, in Claim 10, after "wherein" insert -- the --.

In Column 9, Line 12, in Claim 11, after "the" delete "portions".

Signed and Sealed this
Eighteenth Day of February, 2020

Andrei Iancu
*Director of the United States Patent and Trademark Office*